United States Patent
Ye

(10) Patent No.: US 9,925,569 B2
(45) Date of Patent: Mar. 27, 2018

(54) CHAMBER CLEANING WITH INFRARED ABSORPTION GAS

(71) Applicant: Applied Materials, Inc., Santa Clara, CA (US)

(72) Inventor: Zhiyuan Ye, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 14/010,025

(22) Filed: Aug. 26, 2013

(65) Prior Publication Data

US 2014/0083450 A1    Mar. 27, 2014

Related U.S. Application Data

(60) Provisional application No. 61/705,236, filed on Sep. 25, 2012, provisional application No. 61/772,728, filed on Mar. 5, 2013.

(51) Int. Cl.

| | |
|---|---|
| *H01J 37/32* | (2006.01) |
| *B08B 5/00* | (2006.01) |
| *B08B 7/00* | (2006.01) |
| *C23C 16/44* | (2006.01) |
| *C11D 11/00* | (2006.01) |
| *C11D 7/02* | (2006.01) |
| *C11D 7/22* | (2006.01) |

(52) U.S. Cl.
CPC ............... *B08B 7/005* (2013.01); *C11D 7/02* (2013.01); *C11D 7/22* (2013.01); *C11D 11/007* (2013.01); *C11D 11/0041* (2013.01); *C23C 16/4405* (2013.01); *H01J 37/32522* (2013.01); *H01J 37/32816* (2013.01); *H01J 37/32853* (2013.01); *H01J 37/32862* (2013.01)

(58) Field of Classification Search
CPC .. B08B 7/005; B08B 9/08; B08B 5/00; C23C 16/4405
See application file for complete search history.

(56) References Cited

U.S. PATENT DOCUMENTS

| | | | |
|---|---|---|---|
| 5,421,957 A | 6/1995 | Carlson et al. | |
| 6,042,654 A | 3/2000 | Comita et al. | |
| 6,305,390 B1 * | 10/2001 | Jeon .................... | C23C 16/4405 134/1.1 |
| 6,375,749 B1 * | 4/2002 | Boydston ............... | C23C 16/455 118/728 |
| 6,564,810 B1 * | 5/2003 | Raaijmakers ......... | B08B 7/0035 134/1.1 |
| 7,235,492 B2 | 6/2007 | Samoilov | |
| 7,682,940 B2 | 3/2010 | Ye et al. | |
| 2006/0115933 A1 | 6/2006 | Ye et al. | |
| 2006/0169669 A1 | 8/2006 | Zojaji et al. | |
| 2006/0196525 A1 | 9/2006 | Vrtis et al. | |
| 2007/0224830 A1 | 9/2007 | Samoilov | |
| 2009/0098276 A1 * | 4/2009 | Burrows ........... | C23C 16/45565 427/8 |
| 2010/0273291 A1 | 10/2010 | Kryliouk et al. | |
| 2010/0300482 A1 | 12/2010 | Miura | |
| 2011/0108956 A1 | 5/2011 | Haase et al. | |
| 2011/0306186 A1 | 12/2011 | Huang et al. | |
| 2012/0003599 A1 | 1/2012 | Patalay et al. | |
| 2012/0111272 A1 | 5/2012 | Kryliouk | |

OTHER PUBLICATIONS

International Search Report and Written Opinion dated Dec. 30, 2013 for International Application No. PCT/US2013/056645.

* cited by examiner

*Primary Examiner* — Mikhail Kornakov
*Assistant Examiner* — Natasha N Campbell
(74) *Attorney, Agent, or Firm* — Patterson + Sheridan LLP

(57) ABSTRACT

Methods for conditioning interior surfaces of a process chamber are provided herein. In one embodiment a method of conditioning interior surfaces of a process chamber is provided. The method comprises maintaining a process chamber at a first pressure and at a first temperature of less than about 800 degrees Celsius, providing a process gas to the process chamber at the first pressure and the first temperature, wherein the process gas comprises chlorine ($Cl_2$) and high IR absorption gas, and exposing the process gas to radiant energy to remove residue disposed on interior surfaces of the process chamber.

20 Claims, 4 Drawing Sheets

CHAMBER CLEANING WITH INFRARED ABSORPTION GAS

CROSS-REFERENCE TO RELATED APPLICATIONS

This application claims benefit of U.S. provisional patent application Ser. No. 61/705,236, filed Sep. 25, 2012, and U.S. provisional patent application Ser. No. 61/772,728, filed Mar. 5, 2013, both of which are herein incorporated by reference in their entirety.

BACKGROUND

Field

Embodiments of the present invention generally relate to substrate processing.

Description of the Related Art

Current semiconductor production typically requires periodic process chamber conditioning to remove contaminants, ensure uniformity and prevent process drift. Conventional chamber conditioning processes are typically performed at high temperatures, for example temperatures greater than about 1,000 degrees Celsius. However, current semiconductor fabrication processes are performed at temperatures significantly lower than that of the conditioning process temperatures. As a result of that disparity, the temperature of the process chamber must be continuously increased and decreased, making the conditioning process slow and inefficient. In addition, the repetitive cycling of the process chamber heating elements necessary to achieve the different temperatures reduces the useful life of the process chamber heating elements.

Therefore, the inventors have provided improved methods for low temperature conditioning of interior surfaces of process chambers.

SUMMARY

Methods for conditioning interior surfaces of a process chamber are provided herein. In one embodiment a method of conditioning interior surfaces of a process chamber is provided. The method comprises maintaining a process chamber at a first pressure and at a first temperature of less than about 800 degrees Celsius, providing a process gas to the process chamber at the first pressure and the first temperature, wherein the process gas comprises chlorine ($Cl_2$) and high IR absorption gas, and exposing the process gas to radiant energy to remove residue disposed on interior surfaces of the process chamber.

In another embodiment, a method of conditioning interior surfaces of a process chamber is provided. The method comprises maintaining a process chamber at a first pressure and at a first temperature of less than about 800 degrees Celsius and providing a process gas to the process chamber at the first pressure and the first temperature, wherein the process gas comprises chlorine ($Cl_2$) and hydrogen ($H_2$) and exposing the process gas to radiant energy to remove residue disposed on interior surfaces of the process chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention advantageously provide methods for conditioning interior surfaces of process chambers that remove residue at temperatures substantially similar to the process chamber processing temperature. The inventive methods may advantageously reduce process cycle time between conditioning and processing, thereby increasing temporal and energy efficiency, reducing energy consumption, and extending the useful life of chamber components.

As chamber processing and cleaning temperatures decrease, it becomes desirable to use cleaning gases such as chlorine ($Cl_2$) that are energized at lower temperatures. Typically, chlorine ($Cl_2$) is heated by heating the substrate support which subsequently heats and energizes chlorine ($Cl_2$) gas. However, there is also a trend to move toward susceptorless chamber designs where the backside of the substrate is exposed to a radiant source to achieve more uniform heating of the substrate. Since chlorine ($Cl_2$) is not a good absorber of infrared energy and as a result effective heating of chlorine ($Cl_2$) is challenging. Embodiments described herein provide in gas heating methods for more effectively activating chlorine ($Cl_2$) more effectively. In one embodiment, a high IR absorption gas having a high IR absorption cross-section is added to chlorine ($Cl_2$). The high IR absorption gas is heated by the radiant energy and transfers the energy to chlorine ($Cl_2$) in the gas phase effectively heating and energizing the chlorine ($Cl_2$). In another embodiment a limited amount of hydrogen ($H_2$) is added to chlorine ($Cl_2$). The reaction between $H_2$ and $Cl_2$ is exothermal and heats up the chlorine ($Cl_2$) gases internally activating the remaining $Cl_2$ in the system.

Figure 1:
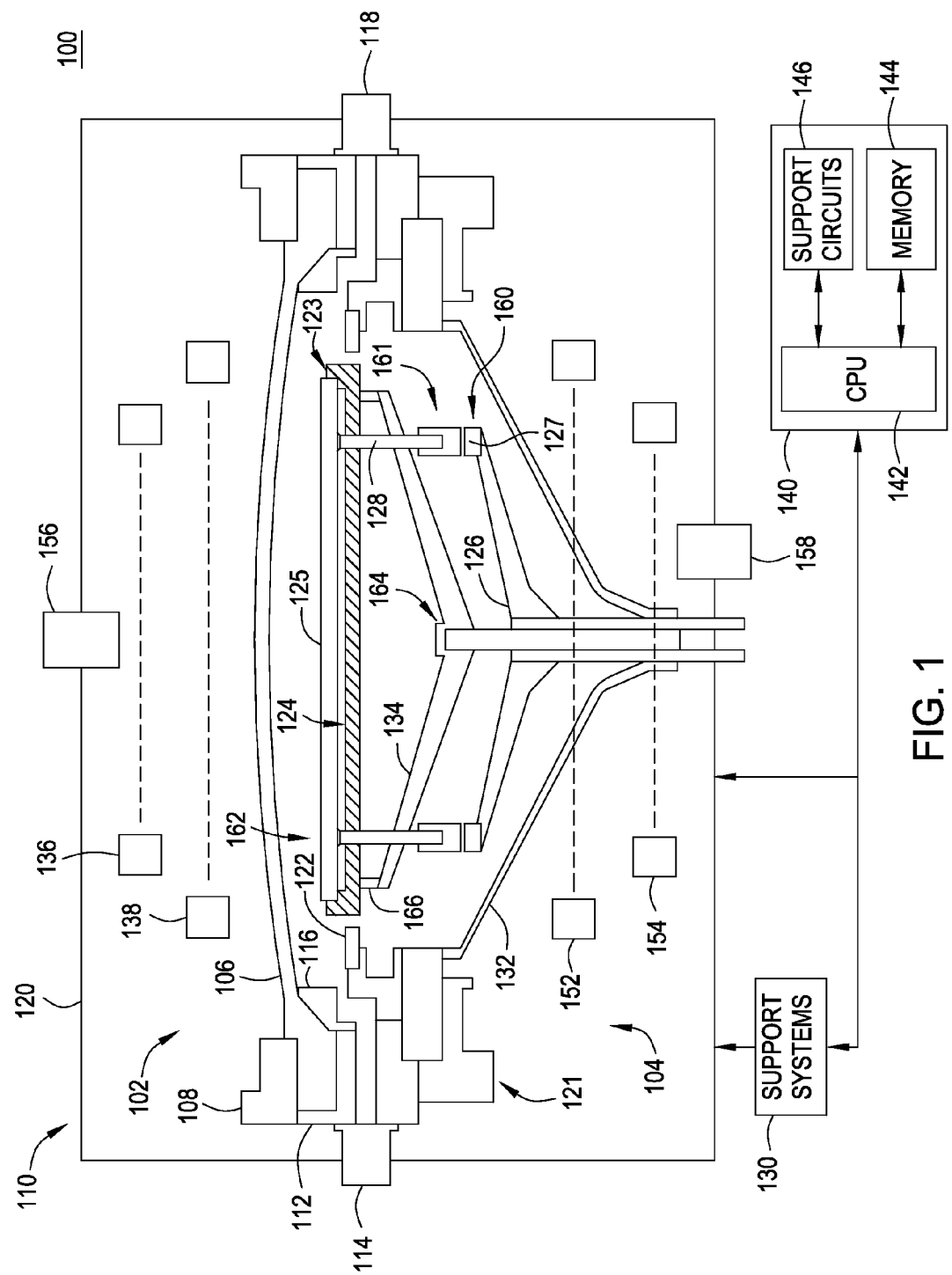
FIG. 1 depicts a process chamber suitable for performing the methods disclosed herein in accordance with certain embodiments of the present invention.
Figure 2:
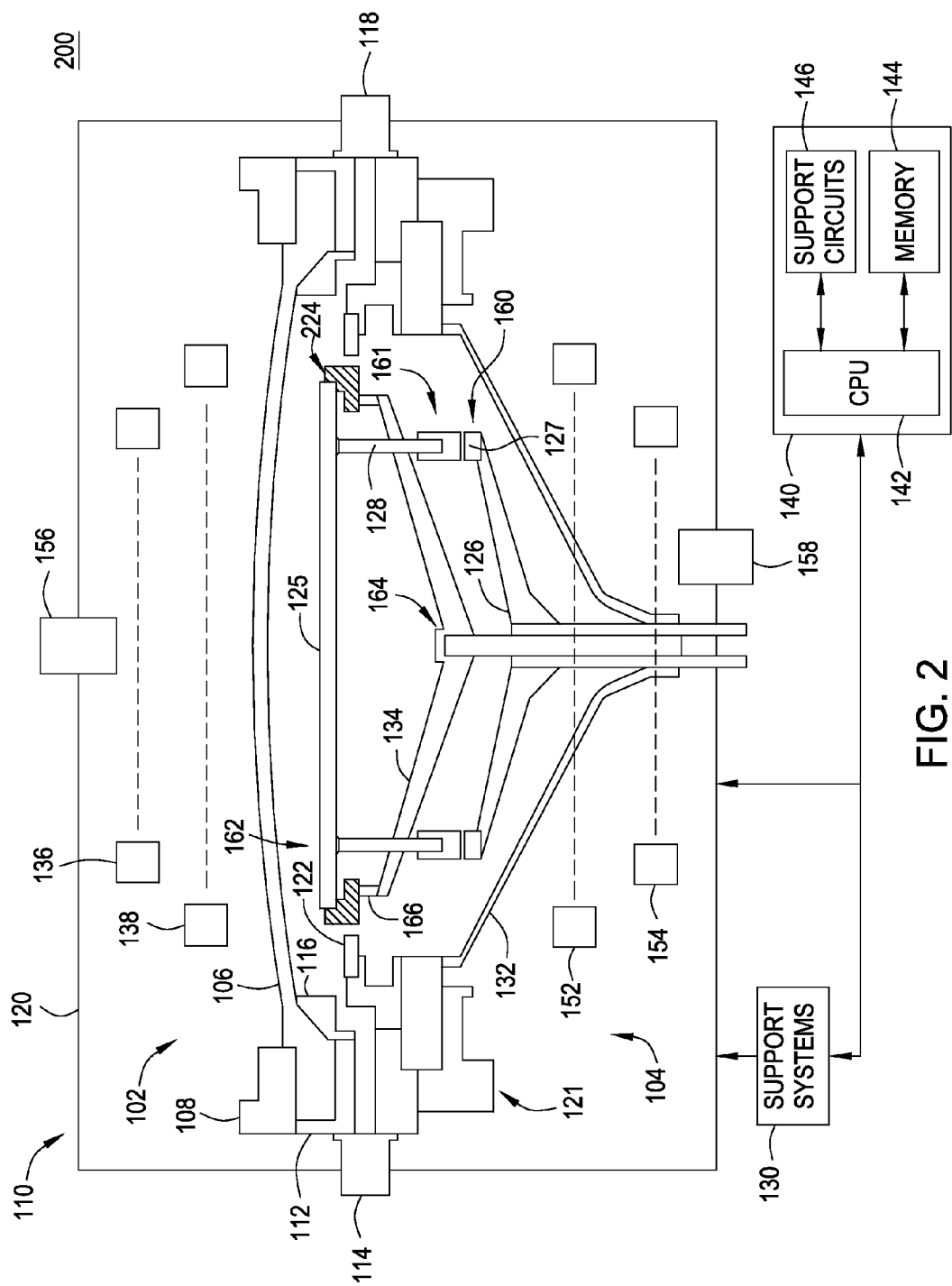
FIG. 2 depicts another process chamber suitable for performing the methods disclosed herein in accordance with certain embodiments of the present invention.

Embodiments of the inventive methods disclosed herein may be used in any suitable process chamber, including those adapted for performing epitaxial deposition processes, such as the RP EPI reactor, available from Applied Materials, Inc. of Santa Clara, Calif. An exemplary process chamber is described below with respect to FIG. 1 and FIG. 2, which depicts a schematic, cross-sectional view of a semiconductor substrate process chamber 100 suitable for performing portions of the present invention. The process chamber 100 may be adapted for performing epitaxial deposition processes and illustratively comprises a chamber body 110, support systems 130, and a controller 140. The process chambers depicted in FIG. 1 and FIG. 2 are illustrative only and the present inventive methods may be used to advantage in other process chambers as well, including those configured for processes other than epitaxial deposition processes.

An exemplary process chamber is described below with respect to FIG. 1, which depicts a schematic, cross-sectional view of a substrate process chamber 100 suitable for use with embodiments of the present invention. The process chamber 100 may be adapted for performing epitaxial deposition processes as discussed above and illustratively comprises a chamber body 110 having a substrate support 124 disposed therein and a multi-zonal heating source (e.g., a multi-zonal energy source). In some embodiments, the multi-zonal energy source may be a multi-zonal radiant energy source, such as provided by one or more of lamps 136, 138, 152, 154 shown in the substrate process chamber 100 of FIG. 1. The one or more lamps 136, 138, 152, 154 emit radiant energy to heat the process gases to a desired temperature to facilitate thermal decomposition of the process gases. The lamps 136, 138, 152, 154 may be adapted to heat the process gases to a temperature of about 300 degrees Celsius to about 1,200 degrees Celsius, such as about 300 degrees Celsius to about 950 degrees Celsius.

The chamber body 110 generally includes an upper portion 102, a lower portion 104, and an enclosure 120. The upper portion 102 is disposed on the lower portion 104 and includes a lid 106, a clamp ring 108, a liner 116, a baseplate 112, one or more upper lamps 136 and one or more lower lamps 138, and an upper pyrometer 156. In one embodiment, the lid 106 has a dome-like form factor; however, lids having other form factors (e.g., flat or reverse curve lids) are also contemplated. The lower portion 104 is coupled to a process gas intake port 114 and an exhaust port 118 and comprises a baseplate assembly 121, a lower dome 132, a substrate support 124 having a support body 123, a pre-heat ring 122, a substrate lift assembly 160, a substrate support assembly 164, one or more upper lamps 152 and one or more lower lamps 154, and a lower pyrometer 158. Although the term "ring" is used to describe certain components of the process chamber, such as the pre-heat ring 122, it is contemplated that the shape of these components need not be circular and may include any shape, including but not limited to, rectangles, polygons, ovals, and the like.

The substrate support 124 provides a support for a substrate during processing and is configured to work in concert with a multi-zonal energy source, such as lamps 136, 138, 152, 154. For example, the substrate support 124 may be a susceptor. The substrate support 124 is typically formed from an optically transparent material, such as quartz, to allow for direct heating of the substrate 125.

During processing, the substrate 125 is disposed on the substrate support 124. The lamps 136, 138, 152, and 154 are sources of infrared (IR) radiation (i.e., heat energy) and, in operation, are used to generate a pre-determined temperature distribution across the substrate 125. The lid 106, the clamp ring 108, and the lower dome 132 may be formed from quartz or other IR-transparent and process-compatible materials.

The substrate support assembly 164 generally includes a support bracket 134 having a plurality of support pins 166 coupled to the substrate support 124. The substrate lift assembly 160 comprises a substrate lift shaft 126 and a plurality of lift pin modules 161 selectively resting on respective pads 127 of the substrate lift shaft 126. In one embodiment, a lift pin module 161 comprises an optional upper portion of the lift pin 128 is movably disposed through a first opening 162 in the substrate support 124. In operation, the substrate lift shaft 126 is moved to engage the lift pins 128. When engaged, the lift pins 128 may raise the substrate 125 above the substrate support 124 or lower the substrate 125 onto the substrate support 124. Further, a rotation mechanism may be provided to rotate the substrate support 124 (and the substrate 125 when disposed thereon).

The support systems 130 include components used to execute and monitor pre-determined processes (e.g., growing epitaxial films) in the process chamber 100. Such components generally include various sub-systems. (e.g., gas panel(s), gas distribution conduits, vacuum and exhaust sub-systems, and the like) and devices (e.g., power supplies, process control instruments, and the like) of the process chamber 100. These components are well known to those skilled in the art and are omitted from the drawings for clarity.

The controller 140 may be provided and coupled to the process chamber 100 for controlling the components of the process chamber 100. The controller 140 may be any suitable controller for controlling the operation of a substrate process chamber. The controller 140 generally comprises a Central Processing Unit (CPU) 142, a memory 144, and support circuits 146 and is coupled to and controls the process chamber 100 and support systems 130, directly (as shown in FIG. 1) or, alternatively, via computers (or controllers) associated with the process chamber and/or the support systems.

The CPU 142 may be any form of a general purpose computer processor that can be used in an industrial setting. The support circuits 146 are coupled to the CPU 142 and may comprise cache, clock circuits, input/output subsystems, power supplies, and the like. Software routines, such as the methods for processing substrates disclosed herein, for example with respect to FIG. 3 and FIG. 4 below, may be stored in the memory 144 of the controller 140. The software routines, when executed by the CPU 142, transform the CPU 142 into a specific purpose computer (controller) 140. The software routines may also be stored and/or executed by a second controller (not shown) that is located remotely from the controller 140. Alternatively or in combination, in some embodiments, for example where the process chamber 100 is part of a multi-chamber processing system, each process chamber of the multi-chamber processing system may have its own controller for controlling portions of the inventive methods disclosed herein that may be performed in that particular process chamber. In such embodiments, the individual controllers may be configured similar to the controller 140 and may be coupled to the controller 140 to synchronize operation of the process chamber 100.

FIG. 2 depicts another process chamber 200 suitable for performing the methods disclosed herein in accordance with certain embodiments of the present invention. Process chamber 200 is similar to process chamber 100 except that the substrate 125 is supported by an annulus or substrate support ring 224 such that the backside of the substrate 125 is exposed during processing.

Figure 3:
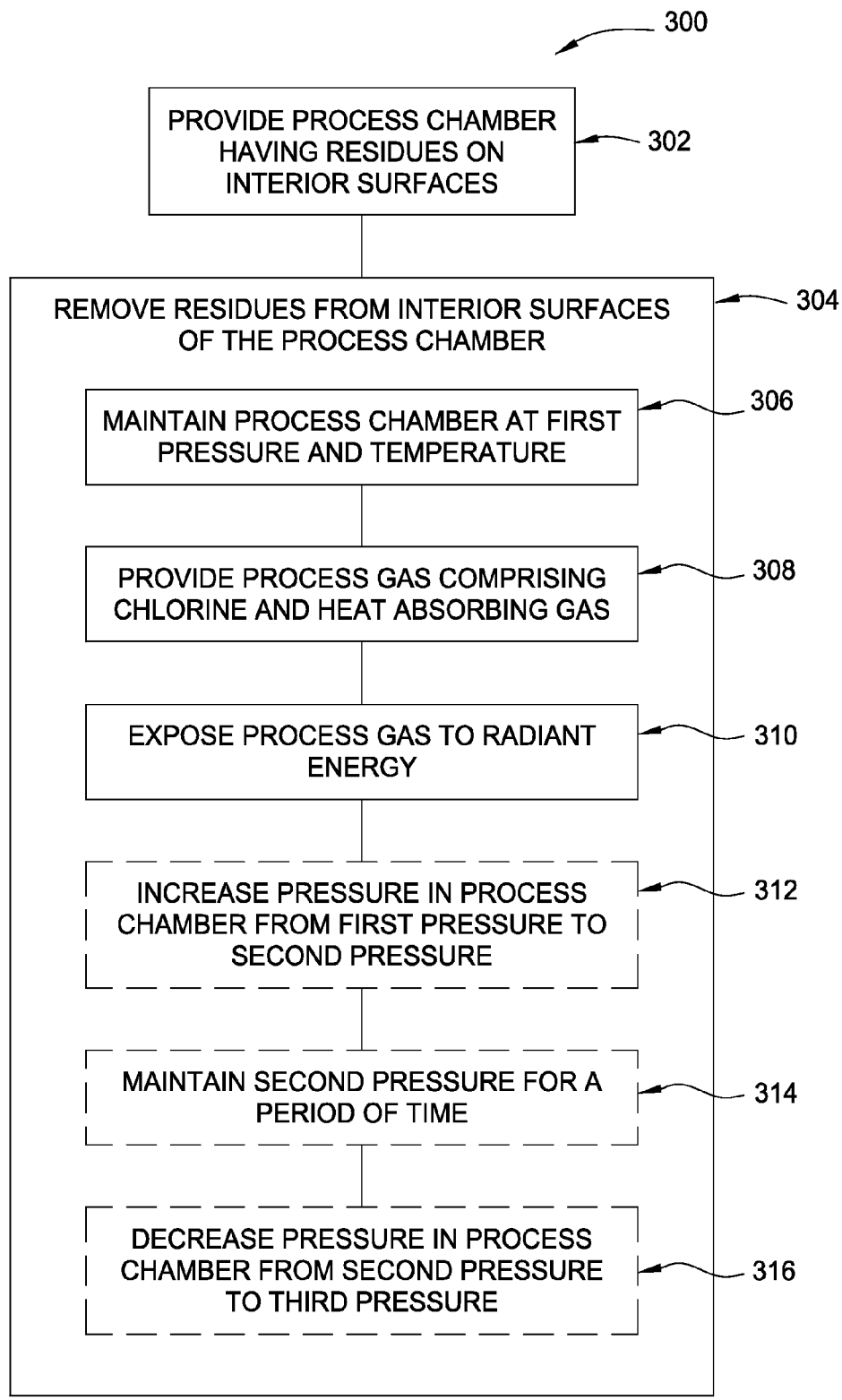
FIG. 3 is a method for conditioning a process chamber in accordance with certain embodiments of the present invention.

FIG. 3 is a method 300 for conditioning a process chamber in accordance with some embodiments of the present invention. The method may be performed in any type of process chamber suitable for substrate processing, for example, such as the process chamber 100 described above with respect to FIG. 1 and FIG. 2.

The method 300 generally begins at block 302 where a process chamber is provided. In certain embodiments, the process chamber may have residue deposited on interior surfaces of the process chamber (such as the chamber wall, substrate support, process kits, and the like). The process chamber may be any process chamber suitable for substrate processing for example, such as the process chamber 100 described above with respect to FIG. 1 and FIG. 2.

The residue may be formed on any of the on the interior surfaces of the process chamber. For example, in embodiments where the process chamber is similar to the process chamber 100 described above, residue may be deposited anywhere within the chamber body 110, for example, such as the pre-heat ring 122, lid 106, lower dome 132, substrate support assembly 164, liners 116, or the like.

Next, at block 304 the residue is removed from the interior surfaces of the process chamber. In certain embodiments, to more effectively remove the residues from the interior surfaces of the process chamber without interference, the residue removal process may be performed with no substrate present in the process chamber. To begin the residue removal process, in certain embodiments, as shown at block 306, the process chamber may be first provided, or maintained, at a first temperature and first pressure. In certain embodiments, the first temperature may be any temperature, for example, less than about 800 degrees Celsius, or in some embodiments about 700 degrees Celsius. In certain embodiments, the first temperature may be any temperature, for example, less than about 600 degrees Celsius. In certain embodiments, the temperature can be as low as 400 to 500 degrees Celsius. In such embodiments, maintaining the temperature at less than about 800 degrees Celsius may reduce or eliminate damage to chamber components (e.g., stainless steel) due to an overly aggressive etch reaction when using some etchant gases, for example, such as chlorine ($Cl_2$).

In certain embodiments, the first temperature may be substantially similar to a processing temperature used during a process performed prior to and/or after performing the residue removal. For example, in certain embodiments, the first temperature may be about 50 degrees Celsius greater than the process temperature, or in certain embodiments, less than the process temperature. In such embodiments, maintaining the first temperature at a temperature substantially similar to the prior processing temperature allows the heating elements of the process chamber (e.g., upper heating lamps 136 and lower heating lamps 154 as described above) to be maintained at a substantially constant temperature, thereby reducing the amount of heating and cooling cycles of the heating element. Reducing the amount of heating and cooling cycles provides for an energy and time efficient process and increases the useful life span of the heating elements.

In certain embodiments, the first pressure may be any pressure for example, such as about 10 Torr to about 40 Torr, or in certain embodiments, greater than about 10 Torr. In certain embodiments, the first pressure and first temperature do not need to be maintained for any particular amount of time, and the process may proceed immediately to any subsequent steps, such as the process of block 308. In certain embodiments, for example, the first pressure and first temperature may be maintained for about 1 to about 60 seconds, or about 10 to about 60 seconds, or in certain embodiments, up to about 30 seconds.

Next, at block 308, a process gas comprising chlorine ($Cl_2$) and a high IR absorption gas may be provided to the process chamber. The process gas etches the residue disposed atop the interior surfaces, thereby facilitating removal of the residue. In certain embodiments, the etching of the residue is facilitated via a thermal chemical process (e.g., the process gas is maintained in a non-plasma state). In certain embodiments, the process gas may be provided to the process chamber via a gas source coupled to the process chamber at a total flow rate of about 3,000 sccm to about 10,000 sccm, or about 7,000 sccm. Chlorine ($Cl_2$) may be flowed into the chamber at a flow rate of about 100 sccm to about 5,000 sccm. In one embodiment, chlorine ($Cl_2$) is flowed into the chamber at a flow rate from about 300 sccm to about 1,500 sccm. In one embodiment, chlorine ($Cl_2$) is flowed into the chamber at a flow rate of about 1,000 sccm. In certain embodiments, the process gas may be provided to the process chamber via a gas source coupled to the process chamber at a total flow rate of about 80 sccm to about 300 sccm per liter of chamber volume, or about 200 sccm per liter of chamber volume. Chlorine ($Cl_2$) may be flowed into the chamber at a flow rate of about 2 sccm to about 140 sccm per liter of chamber volume. In one embodiment, chlorine ($Cl_2$) is flowed into the chamber at a flow rate from about 8 sccm to about 45 sccm per liter of chamber volume. In one embodiment, chlorine ($Cl_2$) is flowed into the chamber at a flow rate of about 25 sccm per liter of chamber volume.

Although the processes of blocks 306, 308 and 310 are shown as separate steps of the method 300, in certain embodiments, any combination of the processes of blocks 306, 308 and 310 may be performed simultaneously. For example, in certain embodiments, the process gas comprising chlorine ($Cl_2$) and the high IR absorption gas may be provided to the process chamber while maintaining the process chamber at the pressures discussed above. For example, in certain embodiments, the process gas comprising chlorine ($Cl_2$) and the high IR absorption gas may be exposed to radiant energy to achieve the temperatures discussed above.

In certain embodiments, the process gas comprises purified chlorine to reduce an amount of moisture (i.e., water) contained with the process gas. For example, in certain embodiments, the chlorine may be purified such that there is about 1 to 10 parts per billion (ppb), or in certain embodiments, less than a part per trillion (ppt) of water. When present, the purified chlorine may minimize contaminant introduction into the process chamber, thereby minimizing damage to process chamber components. In certain embodiments, the chlorine may be filtered through a purifier coupled to the to process chamber to facilitate providing the purified chlorine.

The chlorine ($Cl_2$) component of the process gas facilitates the etching of the residue disposed atop the interior surfaces of the process chamber and the high IR absorption gas absorbs radiation, transfers the heat to the chlorine component effectively energizing the chlorine component. The high IR absorption gas may also act as a carrier to facilitate delivery of the chlorine ($Cl_2$) throughout the process chamber. In addition, in certain embodiments, the high IR absorption gas dilutes the chlorine ($Cl_2$) to prevent etching the process chamber components. In certain embodiments, the process gas may comprise about 0.1 to about 10 percent chlorine ($Cl_2$). Accordingly, in such embodiments, the process gas may comprise about 90 to about 99.9 percent of the high IR absorption gas. For example, in some embodiments, the process gas may comprise about 5 percent ($Cl_2$) and about 95 percent of the high IR absorption gas.

In certain embodiments, the process gas further comprises a carrier gas. Exemplary carrier gases include nitrogen ($N_2$), hydrogen ($H_2$), argon, helium, neon, xenon, and combinations thereof. In one embodiment, the carrier gas is flowed into the chamber at a flow rate from about 500 sccm to about 10,000 sccm. In one embodiment, the carrier gas is flowed into the chamber at a flow rate of from about 2,000 sccm to about 5,000 sccm. In one embodiment, the carrier gas is flowed into the chamber at a flow rate from about 13 sccm to about 300 sccm per liter of chamber volume. In one embodiment, the carrier gas is flowed into the chamber at a flow rate of from about 55 sccm to about 140 sccm per liter of chamber volume.

The high IR absorption gas is typically a polar molecule that has a high IR absorption coefficient. The high IR absorption gas absorbs radiation and transfers the heat to the chlorine component effectively energizing the chlorine component. Exemplary high IR absorption gases include hydrogen chloride (HCl), nitrogen trifluoride ($NF_3$), hydrogen bromide (HBr), carbon tetrachloride ($CCl_4$), silicon tetrachloride ($SiCl_4$), dichlorosilane ($SiH_2Cl_2$), trichlorosilane ($SiHCl_3$), and combinations thereof. In one embodiment, the high IR absorption gas is flowed into the chamber at a flow rate from about 500 sccm to about 10,000 sccm. In one embodiment, the high IR absorption gas is flowed into the chamber at a flow rate of from about 1,000 sccm to about 2,000 sccm. In one embodiment, the high IR absorption gas is flowed into the chamber at a flow rate from about 13 sccm to about 300 sccm per liter of chamber volume. In one embodiment, the high IR absorption gas is flowed into the chamber at a flow rate of from about 25 sccm to about 55 sccm per liter of chamber volume.

Next at block 310, the process gas is exposed to radiant energy. The radiant energy may be visible or invisible. The radiant energy may be generated by an infrared source, for example, lamps 136, 138, 152, and 154. The radiant energy may be generated by the lamps positioned below the process chamber, for example, lamps 152 and 154.

Next, at block 312 the pressure within the process chamber may be increased from the first pressure to a second pressure. The increase in pressure allows for substantially the entire chamber volume to be filled with the process gas, thereby facilitating a complete removal of residue from all chamber components. For example, in embodiments where a substrate susceptor is disposed within the process chamber (e.g., such as in the process chamber 100 described above in FIG. 1), the increase in pressure allows for etching of residue disposed atop the top and bottom surfaces of the substrate susceptor. In embodiments where a substrate susceptor is not present (e.g., such as in the process chamber 100 described above in FIG. 2) the first pressure may be maintained throughout the process. In some embodiments, the second pressure may be about 160 to about 300 Torr, or in some embodiments, less than about 200 Torr. Providing the second pressure in the aforementioned range may facilitate a sufficient etch rate of the residue species. For example, in embodiments where the residue comprises silicon containing or germanium containing residue, the residue may be etched at about 500 to about 5,000 Angstroms per minute (Å/min), or in some embodiments about 1,500 (Å/min), or in some embodiments 2,500 (Å/min).

In certain embodiments, to facilitate increasing the pressure from the first pressure to the second pressure, the process chamber may be isolated (i.e., closing a valve, for example the throttle valve of a vacuum system (not shown) of process chamber 100 described above) and process gas flowed until the desired second pressure is reached. For example, in some embodiments, a rate of the increase (the ramp rate) from the first pressure to the second pressure may provide an adequate amount of force to cause a valve (e.g., a throttle valve) to close, thereby isolating the process chamber. In certain embodiments, the ramp rate may be about 5 to about 10 Torr per second, or in certain embodiments up to about 30 Torr per second. Increasing the pressure via flow of process gas allows for substantially the entire chamber volume to be filled with the process gas, thereby facilitating a complete removal of residue from all chamber components. In certain embodiments, the pressure may be increased over a first period of time, for example, suitable to reach the second pressure and promote a complete etching of all components. In certain embodiments, the pressure within the process chamber may be increased from the first pressure to the second pressure over a first period of time of about 30 to about 45 seconds.

Next, at block 314, the second pressure may optionally be maintained for a second period of time. The second period of time may be any amount of time to allow for sufficient removal of the residue disposed atop the interior surfaces of the process chamber. For example, in some embodiments, the second period of time may be up to about 10 seconds.

Next, at block 316, the pressure in the process chamber may optionally be decreased from the second pressure to a third pressure. In certain embodiments, the third pressure may be any pressure for example, such as about 10 to about 40 Torr, or in certain embodiments, greater than about 10 Torr.

Figure 4:
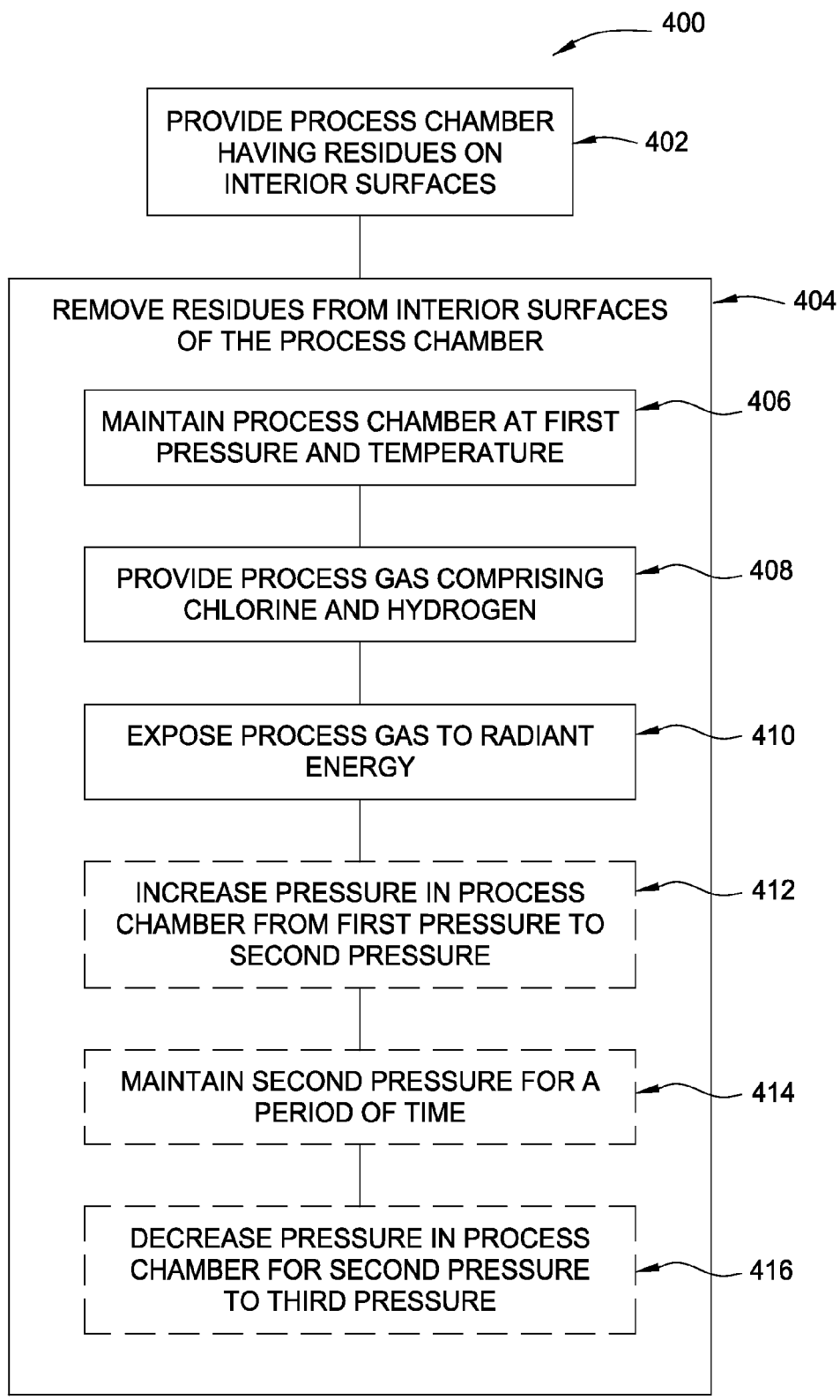
FIG. 4 is another method for conditioning a process chamber in accordance with certain embodiments of the present invention.

FIG. 4 is another method 400 for conditioning a process chamber in accordance with some embodiments of the present invention. The method 400 generally begins at block 302 where a process chamber is provided. The method may be performed in any type of process chamber suitable for substrate processing, for example, such as the process chamber 100 described above with respect to FIG. 1 and FIG. 2.

The residue may be formed on any of the on the interior surfaces of the process chamber. For example, in embodiments where the process chamber is similar to the process chamber 100 described above, residue may be deposited anywhere within the chamber body 110, for example, such as the pre-heat ring 122, lid 106, lower dome 132, substrate support assembly 164, liners 116, or the like.

Next, at block 404 the residue is removed from the interior surfaces of the process chamber. In certain embodiments, to more effectively remove the residues from the interior surfaces of the process chamber without interference, the residue removal process may be performed with no substrate present in the process chamber. To begin the residue removal process, in certain embodiments, as shown at block 406, the process chamber may be first provided, or maintained, at a first temperature and first pressure. In certain embodiments, the process of block 406 may be similar to the process of block 306 as described above. In certain embodiments, the first temperature may be any temperature, for example, less than about 800 degrees Celsius, or in some embodiments about 700 degrees Celsius. In certain embodiments, the temperature can be as low as 400 to 500 degrees Celsius. In such embodiments, maintaining the temperature at less than about 800 degrees Celsius may reduce or eliminate damage to chamber components (e.g., quartz ($SiO_2$) based components) due to an overly aggressive etch reaction when using some etchant gases, for example, such as chlorine ($Cl_2$).

In certain embodiments, the first temperature may be substantially similar to a processing temperature used during a process performed prior to and/or after performing the residue removal. For example, in certain embodiments, the first temperature may be about 50 degrees Celsius greater than the process temperature, or in certain embodiments, less than the process temperature. In such embodiments, maintaining the first temperature at a temperature substantially similar to the prior processing temperature allows the heating elements of the process chamber (e.g., upper heating lamps 136 and lower heating lamps 154 as described above) to be maintained at a substantially constant temperature, thereby reducing the amount of heating and cooling cycles of the heating element. Reducing the amount of heating and cooling cycles provides for an energy and time efficient process and increases the useful life span of the heating elements.

In certain embodiments, the first pressure may be any pressure for example, such as about 10 Torr to about 40 Torr, or in certain embodiments, greater than about 10 Torr. In certain embodiments, the first pressure and first temperature do not need to be maintained for any particular amount of time, and the process may proceed immediately to any subsequent steps, such as the process of block 408. In certain embodiments, for example, the first pressure and first temperature may be maintained for about 1 to about 60 seconds, or about 10 to about 60 seconds, or in certain embodiments, up to about 30 seconds.

Next, at block 408, a process gas comprising chlorine ($Cl_2$) and hydrogen gas ($H_2$) may be provided to the process chamber. The process gas etches the residue disposed atop the interior surfaces, thereby facilitating removal of the residue. In certain embodiments, the etching of the residue is facilitated via a thermal chemical process (e.g., the process gas is maintained in a non-plasma state). In certain embodiments, the process gas may be provided to the process chamber via a gas source coupled to the process chamber at a total flow rate of about 3,000 sccm to about 10,000 sccm, or about 7,000 sccm. Chlorine ($Cl_2$) may be flowed into the chamber at a flow rate of about 100 sccm to about 5,000 sccm. Chlorine ($Cl_2$) may be flowed into the chamber at a flow rate of about 300 sccm to about 4,000 sccm. In one embodiment, chlorine ($Cl_2$) is flowed into the chamber at a flow rate from about 500 sccm to about 3,000 sccm. In one embodiment, chlorine ($Cl_2$) is flowed into the chamber at a flow rate of about 1,500 sccm. In certain embodiments, the process gas may be provided to the process chamber via a gas source coupled to the process chamber at a total flow rate of about 80 sccm to about 300 sccm per liter of chamber volume, or about 200 sccm per liter of chamber volume. Chlorine ($Cl_2$) may be flowed into the chamber at a flow rate of about 2 sccm to about 140 sccm per liter of chamber volume. Chlorine ($Cl_2$) may be flowed into the chamber at a flow rate of about 8 sccm to about 112 sccm per liter of chamber volume. In one embodiment, chlorine ($Cl_2$) is flowed into the chamber at a flow rate from about 13 sccm to about 85 sccm per liter of chamber volume. In one embodiment, chlorine ($Cl_2$) is flowed into the chamber at a flow rate of about 40 sccm per liter of chamber volume.

Although the processes of blocks 406, 408 and 410 are shown as separate steps of the method 400, in certain embodiments, any combination of the processes of blocks 406, 408 and 410 may be performed simultaneously. For example, in certain embodiments, the process gas comprising chlorine ($Cl_2$) and hydrogen gas may be provided to the process chamber while maintaining the process chamber at the pressures discussed above. For example, in certain embodiments, the process gas comprising chlorine ($Cl_2$) and hydrogen gas may be exposed to radiant energy to achieve the temperatures discussed above.

In certain embodiments, the process gas comprises purified chlorine to reduce an amount of moisture (i.e., water) contained with the process gas. For example, in certain embodiments, the chlorine may be purified such that there is about 1 to 10 parts per billion (ppb), or in certain embodiments, less than a part per trillion (ppt) of water. When present, the purified chlorine may minimize contaminant introduction into the process chamber, thereby minimizing damage to process chamber components. In certain embodiments, the chlorine may be filtered through a purifier (e.g., purifier 115 described above in FIG. 1) coupled to the to process chamber to facilitate providing the purified chlorine.

The chlorine ($Cl_2$) component of the process gas facilitates the etching of the residue disposed atop the interior surfaces of the process chamber. In certain embodiments the percent of hydrogen in the process gas is greater than the percent of chlorine ($Cl_2$) in the process gas. The chlorine gas ($Cl_2$) fully reacts with the hydrogen gas to form hot HCl which etches residue from the interior surfaces of the process chamber. The hydrogen gas may also act as a carrier gas. In addition, in certain embodiments, hydrogen gas dilutes the chlorine ($Cl_2$) to prevent etching the process chamber components. In certain embodiments, the process gas may comprise about 0.1 to about 10 percent chlorine ($Cl_2$). Accordingly, in such embodiments, the process gas may comprise about 90 to about 99.9 percent of hydrogen. For example, in some embodiments, the process gas may comprise about 5 percent ($Cl_2$) and about 95 percent of the hydrogen gas. In certain embodiments the ratio of hydrogen to chlorine ($Cl_2$) is greater than 1:1, 1.5:1, 2:1, 3:1, 10:1, 20:1 or 30:1. In certain embodiments the ratio of hydrogen to chlorine ($Cl_2$) is between 20:1 and 30:1.

Chlorine ($Cl_2$) may be flowed into the chamber at a flow rate of about 100 sccm to about 3,000 sccm. Chlorine ($Cl_2$) may be flowed into the chamber at a flow rate of about 300 sccm to about 1,000 sccm. In one embodiment, chlorine ($Cl_2$) is flowed into the chamber at a flow rate of about 500 sccm. Hydrogen gas may be flowed into the chamber at a flow rate from about 1,500 sccm to about 10,000 sccm. In one embodiment, hydrogen gas is flowed into the chamber at a flow rate of from about 3,000 sccm to about 5,000 sccm.

Chlorine ($Cl_2$) may be flowed into the chamber at a flow rate of about 2 sccm to about 85 sccm per liter of chamber volume. Chlorine ($Cl_2$) may be flowed into the chamber at a flow rate of about 8 sccm to about 30 sccm per liter of chamber volume. In one embodiment, chlorine ($Cl_2$) is flowed into the chamber at a flow rate of about 14 sccm per liter of chamber volume. Hydrogen gas may be flowed into the chamber at a flow rate from about 40 sccm to about 300 sccm per liter of chamber volume. In one embodiment, hydrogen gas is flowed into the chamber at a flow rate of from about 80 sccm to about 140 sccm per liter of chamber volume.

In certain embodiments, the process gas further comprises a carrier gas. Exemplary carrier gases include nitrogen ($N_2$), hydrogen ($H_2$), argon, helium, neon, xenon, and combinations thereof. In one embodiment, the carrier gas is flowed into the chamber at a flow rate from about 500 sccm to about 10,000 sccm. In one embodiment, the carrier gas is flowed into the chamber at a flow rate of from about 1,000 sccm to about 2,000 sccm. In one embodiment, the carrier gas is flowed into the chamber at a flow rate from about 12 sccm to about 300 sccm per liter of chamber volume. In one embodiment, the carrier gas is flowed into the chamber at a flow rate of from about 25 sccm to about 56 sccm per liter of chamber volume.

In certain embodiments the percent of chlorine ($Cl_2$) in the process gas is greater than the percent of hydrogen in the process gas. The hydrogen gas reacts with the chlorine component in an exothermal reaction generating heat which heats up the gases and activates the remaining chlorine and the HCl formed from the reaction in the system. The hydrogen gas may also act as a carrier to facilitate delivery of the chlorine ($Cl_2$) throughout the process chamber. In addition, in certain embodiments, hydrogen gas dilutes the chlorine ($Cl_2$) to prevent etching the process chamber components. In certain embodiments, the process gas may comprise about 83 to about 99 percent chlorine ($Cl_2$). Accordingly, in such embodiments, the process gas may comprise about 1 to about 17 percent of hydrogen. Higher percentages may be used for a reduced pressure environment (e.g., 300 Torr). In certain embodiments, the remainder of the process gas may comprise a carrier gas as previously described herein. For example, in some embodiments, the process gas may comprise about 20 percent ($Cl_2$), about 10 percent of the hydrogen gas, and about 70 percent of a carrier gas (e.g., argon or nitrogen). In certain embodiments the ratio of chlorine ($Cl_2$) to hydrogen is greater than 1:1, 1.5:1, 2:1, or 3:1. In certain embodiments the ratio of chlorine ($Cl_2$) to hydrogen is between 1.5:1 and 3:1.

Chlorine ($Cl_2$) may be flowed into the chamber at a flow rate of about 500 sccm to about 5,000 sccm. Chlorine ($Cl_2$) may be flowed into the chamber at a flow rate of about 2,000 sccm to about 3,000 sccm. In one embodiment, chlorine ($Cl_2$) is flowed into the chamber at a flow rate of about 2500 sccm. Hydrogen gas may be flowed into the chamber at a flow rate from about 100 sccm to about 4,000 sccm. In one embodiment, hydrogen gas is flowed into the chamber at a flow rate of from about 1,000 sccm to about 2,000 sccm.

Chlorine ($Cl_2$) may be flowed into the chamber at a flow rate of about 13 sccm to about 140 sccm per liter of chamber volume. Chlorine ($Cl_2$) may be flowed into the chamber at a flow rate of about 55 sccm to about 85 sccm per liter of chamber volume. In one embodiment, chlorine ($Cl_2$) is flowed into the chamber at a flow rate of about 70 sccm per liter of chamber volume. Hydrogen gas may be flowed into the chamber at a flow rate from about 2 sccm to about 115 sccm per liter of chamber volume. In one embodiment, hydrogen gas is flowed into the chamber at a flow rate of from about 25 sccm to about 56 sccm per liter of chamber volume.

In certain embodiments, the process gas further comprises a carrier gas. Exemplary carrier gases include nitrogen ($N_2$), hydrogen ($H_2$), argon, helium, neon, xenon, and combinations thereof. In one embodiment, the carrier gas is flowed into the chamber at a flow rate from about 500 sccm to about 10,000 sccm. In one embodiment, the carrier gas is flowed into the chamber at a flow rate of from about 1,000 sccm to about 2,000 sccm. In one embodiment, the carrier gas is flowed into the chamber at a flow rate from about 12 sccm to about 300 sccm per liter of chamber volume. In one embodiment, the carrier gas is flowed into the chamber at a flow rate of from about 25 sccm to about 56 sccm per liter of chamber volume.

Next, at block 410 the process gas is exposed to radiant energy. The radiant energy may be generated by an infrared source, for example, lamps 136, 138, 152, and 154. The radiant energy may be generated by the lamps positioned below the process chamber, for example, lamps 152 and 154.

Next, at block 412 the pressure within the process chamber may be increased from the first pressure to a second pressure. The increase in pressure allows for substantially the entire chamber volume to be filled with the process gas, thereby facilitating a complete removal of residue from all chamber components. For example, in embodiments where a substrate susceptor is disposed within the process chamber (e.g., such as in the process chamber 100 described above in FIG. 1), the increase in pressure allows for etching of residue disposed atop the top and bottom surfaces of the substrate susceptor. In embodiments where a substrate susceptor is not present (e.g., such as in the process chamber 100 described above in FIG. 2) the first pressure may be maintained throughout the process. In some embodiments, the second pressure may be about 160 to about 300 Torr, or in some embodiments, less than about 200 Torr. Providing the second pressure in the aforementioned range may facilitate a sufficient etch rate of the residue species. For example, in embodiments where the residue comprises silicon containing or germanium containing residue, the residue may be etched at about 1,000 to about 4,000 Angstroms per minute (Å/min), or in some embodiments about 1,500 (Å/min), or in some embodiments 2,500 (Å/min).

In certain embodiments, to facilitate increasing the pressure from the first pressure to the second pressure, the process chamber may be isolated (i.e., closing a valve, for example the throttle valve of a vacuum system of process chamber 100 described above)) and process gas flowed until the desired second pressure is reached. For example, in some embodiments, a rate of the increase (the ramp rate) from the first pressure to the second pressure may provide an adequate amount of force to cause a valve (e.g., a throttle valve) to close, thereby isolating the process chamber. In certain embodiments, the ramp rate may be about 5 to about 10 Torr per second, or in certain embodiments up to about 30 Torr per second. Increasing the pressure via flow of process gas allows for substantially the entire chamber volume to be filled with the process gas, thereby facilitating a complete removal of residue from all chamber components. In certain embodiments, the pressure may be increased over a first period of time, for example, suitable to reach the second pressure and promote a complete etching of all components. In certain embodiments, the pressure within the process chamber may be increased from the first pressure to the second pressure over a first period of time of about 30 to about 45 seconds.

Next, at block 414, the second pressure may optionally be maintained for a second period of time. The second period of time may be any amount of time to allow for sufficient removal of the residue disposed atop the interior surfaces of the process chamber. For example, in some embodiments, the second period of time may be up to about 10 seconds.

Next, at block 416, the pressure in the process chamber may optionally be decreased from the second pressure to a third pressure. In certain embodiments, the third pressure may be any pressure for example, such as about 10 to about 40 Torr, or in certain embodiments, greater than about 10 Torr.

While the foregoing is directed to embodiments of the present invention, other and further embodiments of the invention may be devised without departing from the basic scope thereof, and the scope thereof is determined by the claims that follow.

The invention claimed is:
1. A method of conditioning interior surfaces of a process chamber, comprising:
   maintaining a process chamber at a first pressure and at a first temperature of less than about 800 degrees Celsius, wherein the process chamber is susceptorless and includes a substrate support ring for supporting a substrate while exposing a backside of the substrate;
   providing a silicon-free process gas to the process chamber at the first pressure and the first temperature, wherein the silicon-free process gas comprises chlorine ($Cl_2$) and hydrogen ($H_2$); and exposing the silicon-free process gas to infrared radiation to remove residue disposed on interior surfaces of the process chamber via a thermal chemical process, wherein the silicon-free process gas is maintained in a non-plasma state, the exposing the silicon-free process gas to infrared radiation comprises reacting the chlorine ($Cl_2$) with the hydrogen ($H_2$) to form hot HCl, and the infrared radiation is generated by an infrared source positioned below the process chamber.

2. The method of claim 1, wherein the ratio of chlorine ($Cl_2$) to hydrogen ($H_2$) is greater than 1.

3. The method of claim 1, wherein the silicon-free process gas comprises about 83 to about 99 percent chlorine ($Cl_2$) and about 1 to about 17 percent hydrogen ($H_2$) by volume.

4. The method of claim 1, wherein the ratio of hydrogen ($H_2$) to chlorine ($Cl_2$) is greater than 1.

5. The method of claim 4, wherein the silicon-free process gas comprises about 90 to about 99.9 percent hydrogen ($H_2$) and about 0.1 to about 10 percent chlorine ($Cl_2$) by volume.

6. The method of claim 1, further comprising:
performing an epitaxial deposition process prior to providing the silicon-free process gas to the process chamber.

7. The method of claim 1, wherein the residue comprises at least one of silicon (Si) and germanium (Ge).

8. The method of claim 1, wherein the silicon-free process gas further comprises a carrier gas selected from nitrogen ($N_2$), argon, helium, neon, xenon, and combinations thereof.

9. The method of claim 1, wherein the reacting the chlorine ($Cl_2$) with the hydrogen ($H_2$) to form hot HCl generates heat, which activates remaining chlorine gas and the HCl formed from the reaction.

10. The method of claim 1, further comprising removing a substrate from the process chamber prior to providing the silicon-free process gas to the process chamber at the first pressure and the first temperature.

11. A method of conditioning interior surfaces of a process chamber, comprising:
maintaining a process chamber at a first pressure and at a first temperature of less than about 800 degrees Celsius, wherein the process chamber is susceptorless and includes a substrate support ring for supporting a substrate while exposing a backside of the substrate;
providing a silicon-free process gas to the process chamber at the first pressure and the first temperature, wherein the silicon-free process gas comprises chlorine ($Cl_2$) and hydrogen ($H_2$); and
exposing the silicon-free process gas to infrared radiation to remove residue disposed on interior surfaces of the process chamber via a thermal chemical process, wherein the silicon-free process gas is maintained in a non-plasma state, the exposing the silicon-free process gas to infrared radiation comprises reacting the chlorine ($Cl_2$) with the hydrogen ($H_2$) to form hot HCl, and the infrared radiation is generated by an infrared source positioned below the process chamber; and
increasing the pressure in the process chamber from the first pressure to a second pressure while continuing to provide the silicon-free process gas to the process chamber.

12. The method of claim 11, wherein the second pressure is about 160 to about 300 Torr.

13. The method of claim 12, further comprising:
decreasing the pressure in the process chamber from the second pressure to a third pressure, wherein the third pressure is about 10 to about 40 Torr.

14. The method of claim 11, wherein the ratio of hydrogen ($H_2$) to chlorine ($Cl_2$) is greater than 1.

15. The method of claim 14, wherein the silicon-free process gas comprises about 90 to about 99.9 percent hydrogen ($H_2$) and about 0.1 to about 10 percent chlorine ($Cl_2$) by volume.

16. The method of claim 11, further comprising:
performing an epitaxial deposition process prior to providing the silicon-free process gas to the process chamber.

17. The method of claim 11, wherein the residue comprises at least one of silicon (Si) and germanium (Ge).

18. The method of claim 11, wherein the silicon-free process gas further comprises a carrier gas selected from nitrogen ($N_2$), argon, helium, neon, xenon, and combinations thereof.

19. The method of claim 11, wherein reacting the chlorine ($Cl_2$) with the hydrogen ($H_2$) to form hot HCl generates heat, which activates remaining chlorine gas, and the HCl formed from the reaction.

20. The method of claim 11, further comprising removing a substrate from the process chamber prior to providing the silicon-free process gas to the process chamber at the first pressure and the first temperature.

* * * * *